(12) United States Patent
Chan et al.

(10) Patent No.: US 6,501,122 B1
(45) Date of Patent: Dec. 31, 2002

(54) FLASH DEVICE HAVING A LARGE PLANAR AREA ONO INTERPOLY DIELECTRIC

(75) Inventors: Lap Chan, Singapore (SG); Cher Liang Cha, Singapore (SG)

(73) Assignee: Chartered Semiconductor Manufacturing Ltd., Sinagpore (SG)

(*) Notice: Subject to any disclaimer, the term of this patent is extended or adjusted under 35 U.S.C. 154(b) by 0 days.

(21) Appl. No.: 09/534,166

(22) Filed: Mar. 24, 2000

Related U.S. Application Data

(62) Division of application No. 09/053,855, filed on Apr. 2, 1998, now Pat. No. 6,051,467.

(51) Int. Cl.⁷ .............................................. H01L 29/788
(52) U.S. Cl. ........................................ 257/315; 257/314
(58) Field of Search ................................ 257/315, 324, 257/314, 316, 318, 319, 321, 322; 438/201, 211, 257

(56) References Cited

U.S. PATENT DOCUMENTS

| | | | |
|---|---|---|---|
| 5,416,349 A | * 5/1995 | Bergemont | 257/316 |
| 5,457,061 A | 10/1995 | Hong et al. | 437/43 |
| 5,600,166 A | * 2/1997 | Clementi et al. | 257/324 |
| 5,619,052 A | * 4/1997 | Chang et al. | 257/321 |
| 5,625,213 A | 4/1997 | Hong et al. | 257/321 |
| 5,776,811 A | * 7/1998 | Wang et al. | 438/264 |
| 6,157,059 A | * 12/2000 | Kauffman et al. | 257/316 |
| 6,190,966 B1 | * 2/2001 | Ngo et al. | 438/257 |

* cited by examiner

Primary Examiner—Steven Loke
Assistant Examiner—Douglas W. Owens
(74) Attorney, Agent, or Firm—George O. Saile; Rosemary L. S. Pike

(57) ABSTRACT

A new method of fabricating a stacked gate Flash EEPROM device having an improved interpoly oxide layer is described. A gate oxide layer is provided on the surface of a substrate. A first polysilicon layer is deposited overlying the gate oxide layer and patterned to form a floating gate. Source and drain regions associated with the floating gate are formed within the substrate. An oxide layer is deposited overlying the floating gate and the substrate. The oxide layer is polished away until the top of the oxide layer is even with the top of the floating gate. A second polysilicon layer is deposited overlying the oxide layer and the first polysilicon layer of the floating gate wherein the second polysilicon layer has a smooth surface. An interpoly dielectric layer is deposited overlying the second polysilicon layer. A third polysilicon layer is deposited overlying the interpoly dielectric layer. The third polysilicon layer and the interpoly dielectric layer are patterned to form a control gate overlying the floating gate. An insulating layer is deposited overlying the oxide layer and the control gate. Contact openings are formed through the insulating layer to the underlying control gate and to the underlying source and drain regions. The contact openings are filled with a conducting layer to complete the fabrication of the Flash EEPROM device.

19 Claims, 5 Drawing Sheets

FLASH DEVICE HAVING A LARGE PLANAR AREA ONO INTERPOLY DIELECTRIC

This is a division of patent application Ser. No. 09/053,855, filing date Apr. 2, 1998 now U.S. Pat. No. 6,051,467 A Method To Fabricate A Large Planar Area Ono Interpoly Dielectric In Flash Device, assigned to the same assignee as the present invention.

BACKGROUND OF THE INVENTION (1) Field of the Invention

The invention relates to a method of fabricating semiconductor memory devices employing stacked gates, and more particularly, to a method of fabricating memory devices employing stacked gates having an improved interpoly dielectric layer.

(2) Description of the Prior Art

One class of semiconductor memory devices employs floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. A Flash EEPROM is a device in which the entire array, or a large subset, of the memory cells can be erased simultaneously. A stacked gate Flash EEPROM device has a floating gate which is isolated from the channel and source/drain regions by an insulating layer. An interpoly dielectric layer is formed overlying the floating gate to isolate it from the overlying control gate.

Negative voltage biasing and negative constant current stressing in present Flash memory devices give deleterious results. The major cause of these unfavorable behaviors is the rough surface presented by the floating polysilicon layer of the floating gate. Because of unfavorable surface conditions, a tremendous number of interfacial sites can be generated at the local interface between the bottom oxide layer of the ONO interpoly dielectric stack and the floating polysilicon. These trapping/detrapping sites contribute to the degradation of the integrity of the Flash device. The rough surface of the floating polysilicon can also aggravate the surface condition of the nitride layer of the ONO stack. Therefore, a second imperfect interface results between the silicon nitride layer and the top oxide layer of the ONO stack. The rough surface of the floating polysilicon layer can also result in the formation of convex edges at the top polysilicon layer. These edges can intensify any electrical fields that are present.

U.S. Pat. Nos. 5,625,213 and 5,457,061 to Hong et al show a method of fabricating a Flash EEPROM stacked gate structure wherein the interpoly dielectric layer is formed over the polysilicon layer and both are patterned to form the floating gate. U.S. Pat. No. 5,619,052 to Chang et al teaches forming an ONO interpoly dielectric layer in which the nitride layer is thinner than either of the sandwiching oxide layers.

SUMMARY OF THE INVENTION

A principal object of the present invention is to provide an effective and very manufacturable method of fabricating a stacked gate Flash EEPROM device.

Another object of the present invention is to provide an effective and very manufacturable method of fabricating a stacked gate Flash EEPROM device having an improved interpoly dielectric layer.

In accordance with the objects of this invention a new method of fabricating a stacked gate Flash EEPROM device having an improved interpoly dielectric layer is achieved. A gate oxide layer is provided on the surface of a semiconductor substrate. A first polysilicon layer is deposited overlying the semiconductor substrate. The first polysilicon layer is etched away where it is not covered by a mask to form a floating gate. Source and drain regions associated with the floating gate are formed within the semiconductor substrate. An oxide layer is deposited overlying the floating gate and the semiconductor substrate. The oxide layer is polished away until the top of the oxide layer is even with the top of the floating gate. A second polysilicon layer is deposited overlying the oxide layer and the first polysilicon layer of the floating gate wherein the second polysilicon layer has a smooth surface. An interpoly dielectric layer is deposited overlying the second polysilicon layer. A third polysilicon layer is deposited overlying the interpoly dielectric layer. The third polysilicon layer and the interpoly dielectric layer are etched away where they are not covered by a mask to form a control gate overlying the floating gate. An insulating layer is deposited overlying the oxide layer and the control gate. Contact openings are formed through the insulating layer to the underlying control gate and to the underlying source and drain regions. The contact openings are filled with a conducting layer to complete the fabrication of the Flash EEPROM device.

Also in accordance with the objects of this invention, a stacked gate Flash EEPROM device having an improved interpoly oxide layer is described. A polysilicon floating gate having an oxide layer thereunder lies on the surface of a semiconductor substrate. Associated source and drain regions lie within the semiconductor substrate. A polysilicon layer overlies the floating gate wherein the top surface of the polysilicon layer is smooth. An interpoly dielectric layer overlies the polysilicon layer. A control gate overlies the interpoly dielectric layer. An insulating layer overlies the semiconductor substrate and the control gate. A patterned metal layer overlies the insulating layer and extends through contact openings in the insulating layer to the underlying control gate and to the underlying source and drain regions to complete the Flash EEPROM device.

BRIEF DESCRIPTION OF THE DRAWINGS

In the accompanying drawings forming a material part of this description, there is shown.

DESCRIPTION OF THE PREFERRED EMBODIMENTS

Figure 1:
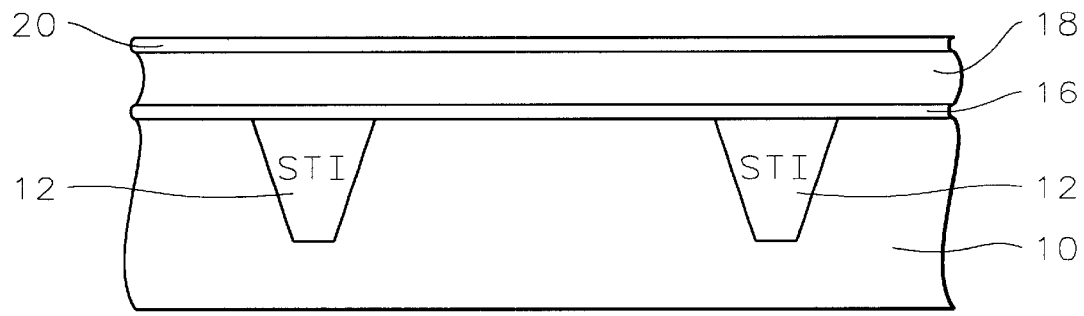
FIGS. 1 through 10 schematically illustrate in cross-sectional representation a preferred embodiment of the present invention.

Referring now more particularly to FIG. 1, there is illustrated a portion of a partially completed memory cell. Semiconductor substrate 10 is preferably composed of monocrystalline silicon. Isolation regions are formed in or on the semiconductor substrate to isolate active regions from one another. For example, as shown in FIG. 1, shallow trench isolation regions 12 may be formed in the semiconductor substrate and filled with an insulating material. Other isolation methods, such as local oxidation of silicon (LOCOS) or other methods may also be used.

Figure 2:
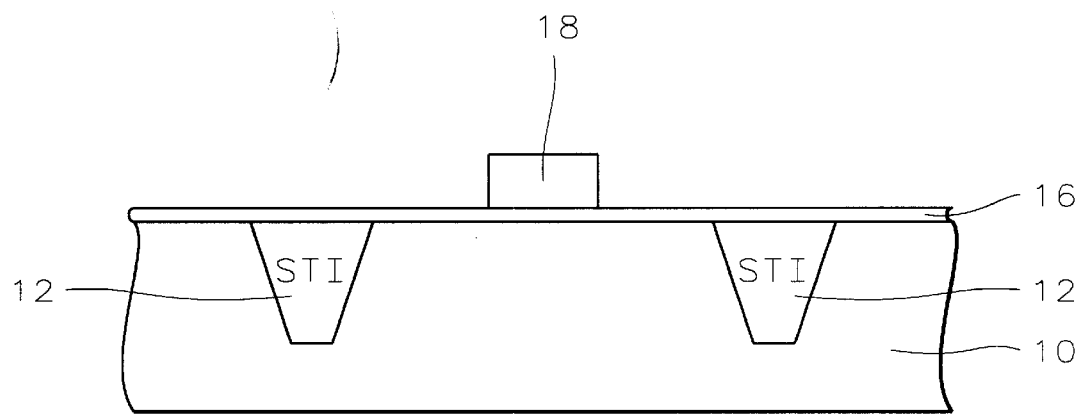
Figure 3:
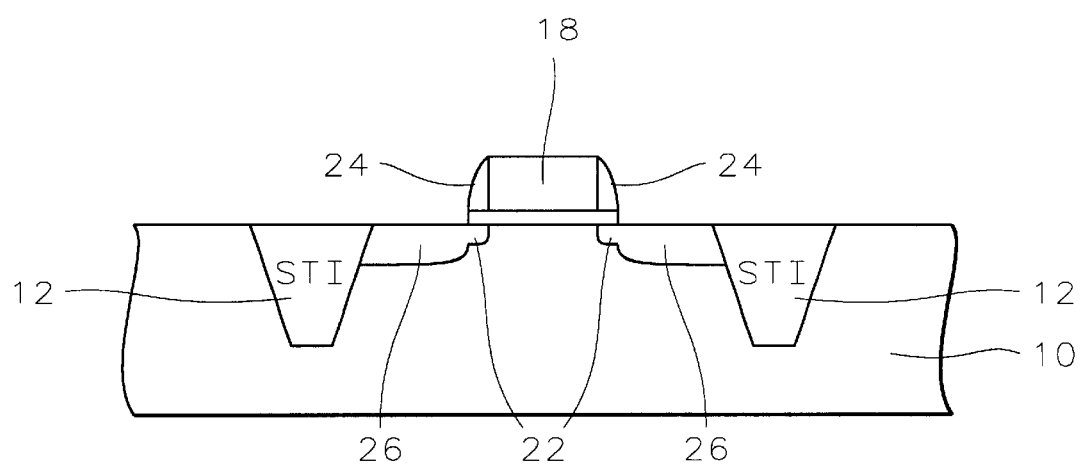

The surface of the substrate is oxidized to form the gate oxide layer 16. A layer of polysilicon 18 is deposited over the surface of the substrate to a thickness of between about 800 and 2000 Angstroms. If necessary, an organic or inorganic layer, such as silicon oxynitride, is deposited over the polysilicon layer as a barrier and anti-reflective coating (BARC) layer 20. The BARC layer 20 will not be shown in subsequent figures because it should be unnecessary. The polysilicon layer is patterned to form the bottom portion of a floating gate, as shown in FIG. 2. As illustrated in FIG. 3, lightly doped source and drain regions 22 are implanted into the semiconductor substrate. Sidewall spacers 24 of silicon oxide or silicon nitride are formed on the sidewalls of the floating gate. Source and drain regions 26 are formed within the substrate, as conventional in the art.

Figure 4:
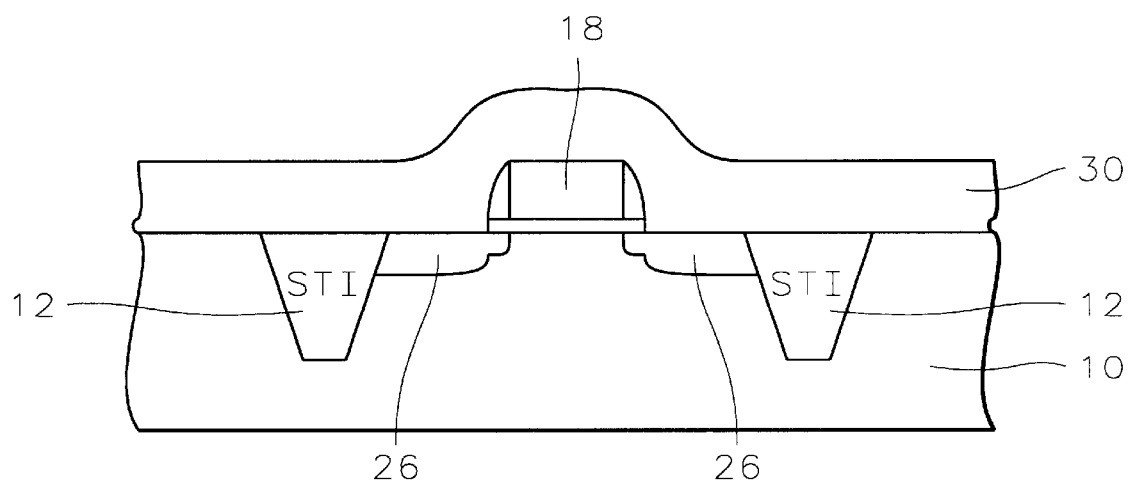
Figure 5:
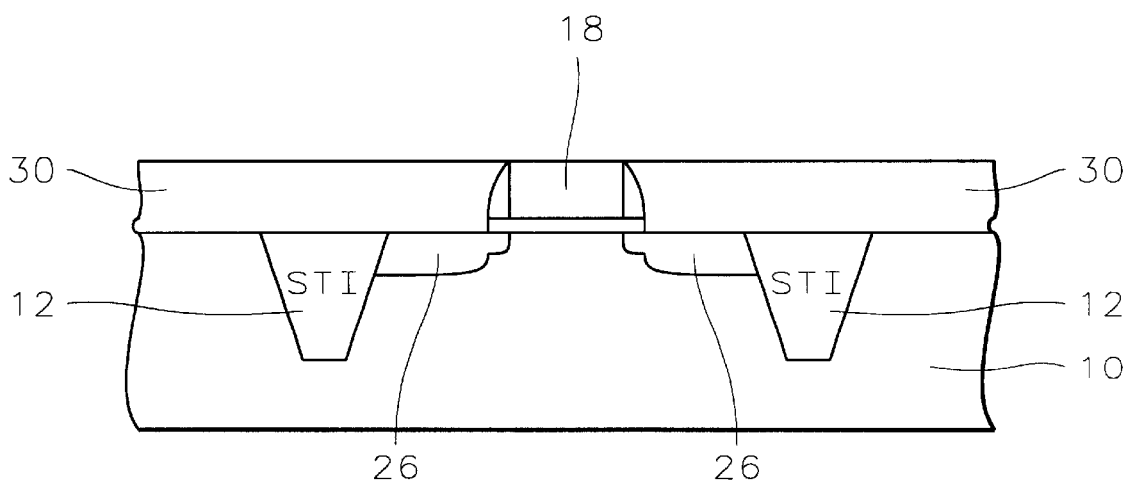

Referring now to FIG. 4, an oxide layer 30 is blanket deposited over the substrate by atmospheric pressure chemical vapor deposition (APCVD) or plasma-enhanced chemical vapor deposition (PECVD) to a thickness of between about 8000 and 10,000 Angstroms. The oxide layer may comprise a first layer of undoped silicon dioxide having a thickness of 1000 to 3000 Angstroms and a second layer of boron and phosphorus doped silicon dioxide having a thickness of between about 7000 and 9000 Angstroms. The oxide layer 30 is polished using, for example, chemical mechanical polishing (CMP) with a polish stop at the polysilicon layer 18, as shown in FIG. 5. If a BARC layer is used, the BARC layer may be used as a polish stop and then removed.

After CMP, the top surface of the floating polysilicon gate 18 should be very smooth. This is a key feature of the present invention. The polished surface of polysilicon 18 and oxide 30 provides a smooth base for the overlying polysilicon layer.

Figure 6:
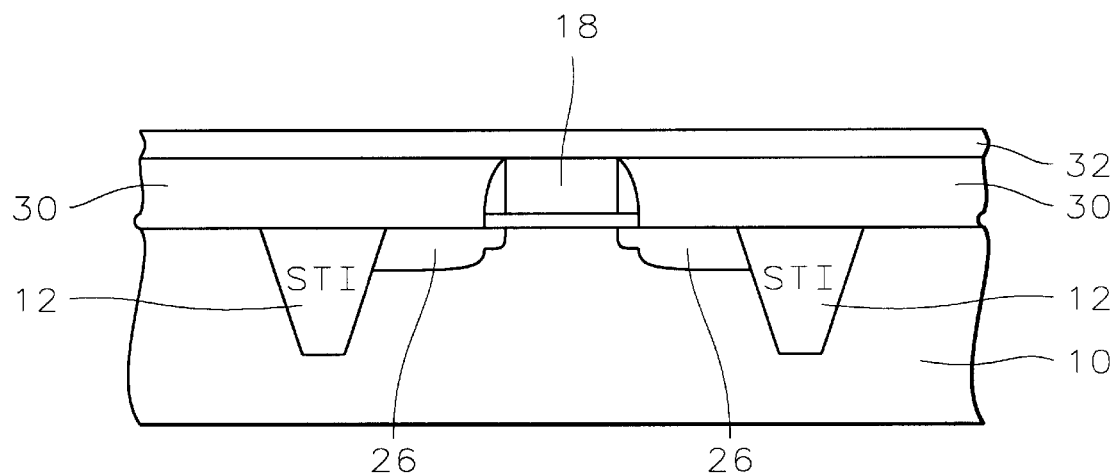

Referring now to FIG. 6, a thin layer of polysilicon 32 is deposited over the polished surface of the substrate. The polysilicon layer 32 is deposited by low pressure chemical vapor deposition (LPCVD) to a thickness of between about 500 and 1500 Angstroms. The polysilicon layer 32 is in-situ doped, as conventional in the art. The new polysilicon surface of 32 will be as planar as the top surface of 18 so that there will be a better interface between the polysilicon and the overlying oxide layer than in the prior art. The polysilicon layer 32 will form a top portion of the floating gate.

A second key feature of the invention is the LPCVD deposition of the polysilicon layer 32. Because this is a low temperature deposition, the grain size of both polysilicon layers 18 and 32 will be small. Large grain sizes would tend to aggravate surface conditions. Also, the in-situ doping of the layer 32 avoids implantation damage to the surface, thereby keeping the surface smooth.

Figure 7:
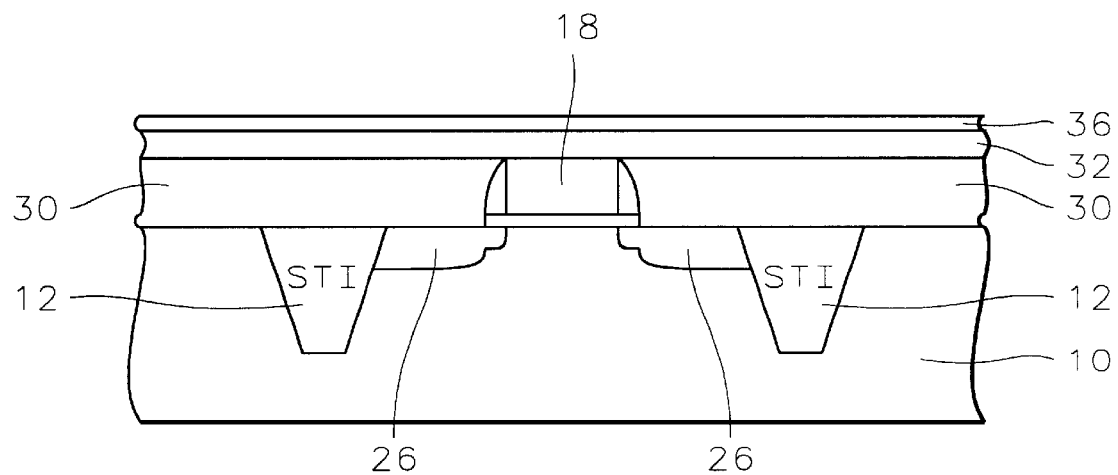

Referring now to FIG. 7, the ONO interpoly dielectric 36 is deposited. Typically, the first layer of the ONO stack is silicon oxide having a thickness of between about 50 and 100 Angstroms. The second layer is silicon nitride having a thickness of between about 50 and 100 Angstroms. The topmost layer is another silicon oxide layer having a thickness of between about 20 and 50 Angstroms.

Figure 8:
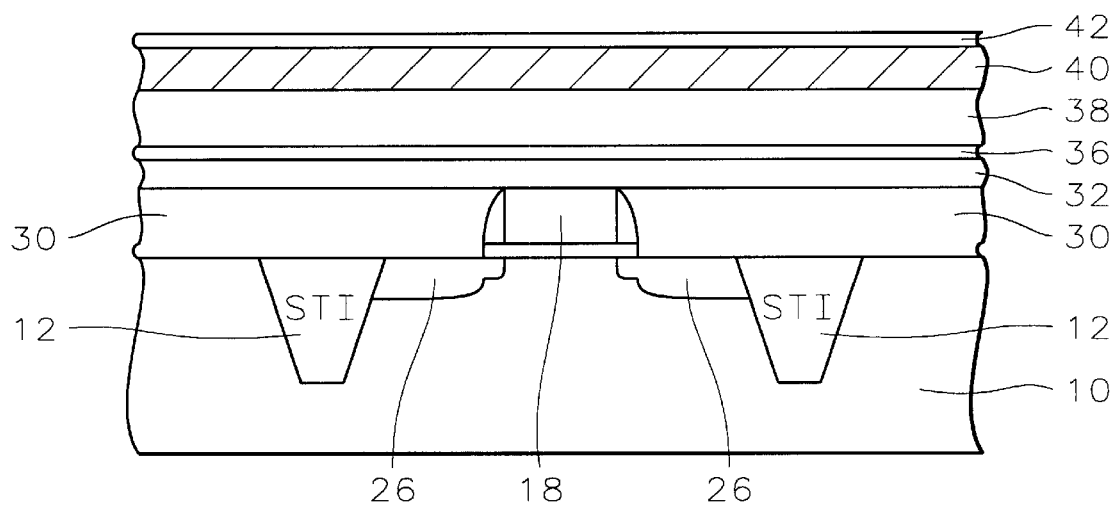

A third polysilicon layer 38 is deposited over the ONO layer and doped. This polysilicon layer will form the control gate of the Flash device. Optionally, a silicide layer such as tungsten silicide 40 may be formed over the polysilicon layer 38 to improve conductivity. Then a capping polysilicon layer 42 is deposited over the silicide layer to provide for better adhesion and prevent peeling of the silicide layer. This is illustrated in FIG. 8.

Figure 9:
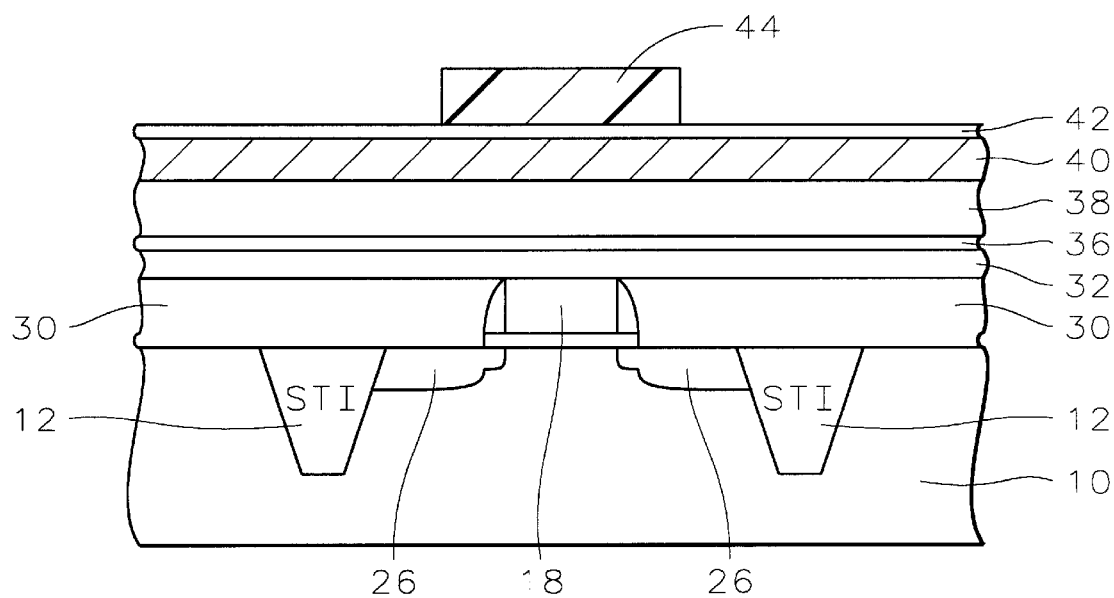

Referring now to FIG. 9, a photoresist mask 44 is formed over the capping polysilicon layer 42. The width of the photoresist mask can be varied via photolithography techniques or reticle masking. In this way, by varying the widths of the polysilicon control gate and the ONO interpoly dielectric layer, the capacitance of the floating gate can be altered. By changing the widths of the polysilicon control gate, the relative coupling ratio can be varied. Hence, different voltage applications can be employed to do programming and/or erasing of devices. In the process of the present invention, there is a large window of process operating voltages.

A third key feature of the present invention is that the presence of the polysilicon layer 32 provides an avenue for varying the width of the control gate while providing for a workable Flash device.

Figure 10:
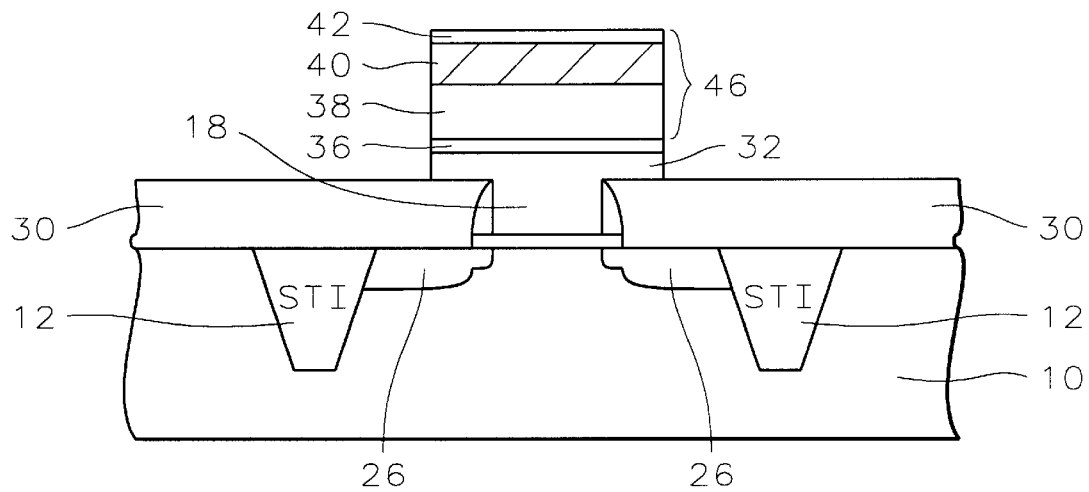

The polysilicon stack is now etched away where it is not covered by the photoresist mask 44 with an etch stop at the silicon oxide layer 30. The resulting control gate 46, comprising the capping polysilicon layer 42, the silicide layer 40, and the third polysilicon layer 38, is shown in FIG. 10. The polysilicon layers 18 and 32 together form the floating gate, having a thickness of between about 1300 and 3500 Angstroms.

Figure 11:
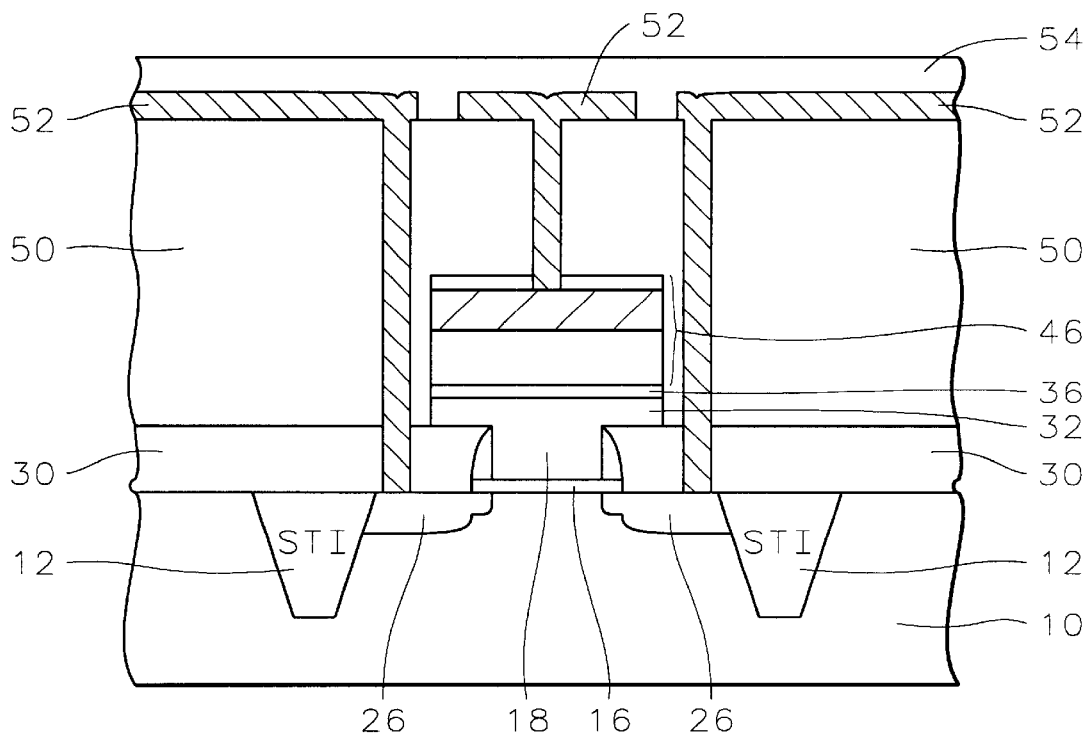
FIG. 11 schematically illustrates in cross-sectional representation a completed memory cell of the present invention.

FIG. 11 shows a completed Flash EEPROM device fabricated according to the process of the present invention. The device is completed as is conventional in the art. For example, a thick dielectric layer 50, such as borophosphosilicate glass (BPSG), phosphosilicate glass (PSG), silicon dioxide, or a combination of these materials, is deposited over the stacked control gate structure. Contact openings are etched through the dielectric layer to expose regions where contact is desired, such as source and drain regions 26 and the silicide layer 40 of the control gate. Metal layer 52, typically aluminum, is deposited and patterned to complete the contacts. Passivation layer 54 covers the patterned metal layer.

The improved Flash EEPROM device having an improved interpoly dielectric layer of the present invention will now be described with reference to FIG. 11. A polysilicon floating gate 18/32 having an oxide layer 16 thereunder lies on the surface of a semiconductor substrate 10. Associated source and drain regions 26 lie within the semiconductor substrate. The polysilicon layer 18 forms a bottom portion of the floating gate and polysilicon layer 32 forms the top portion of the floating gate wherein the top surface of the polysilicon layer 32 is smooth. An interpoly dielectric layer 36 overlies the polysilicon layer. A control gate 46 overlies the interpoly dielectric layer. An insulating layer 50 overlies the semiconductor substrate and the control gate. A patterned metal layer 52 overlies the insulating layer and extends through contact openings in the insulating layer to the underlying control gate 46 and to the underlying source and drain regions 26 to complete the Flash EEPROM device.

The process of the present invention provides a very manufacturable process for fabricating a Flash EEPROM device having an improved interpoly dielectric layer. The polishing step of the present invention provides a smooth surface for the interface with the ONO interpoly dielectric layer. The low temperature deposition and in-situ doping of the second polysilicon layer preserves the smoothness of the polysilicon surface for the interface with the dielectric layer. Because of the improved interface, there is less generation of interfacial sites and, therefore, less generation of convex edges of the overlying polysilicon control gate. With the reduction of these adverse entities to the integrity of the Flash device, the device should register better electrical performance, such as charge retention, and electrical tolerance. The extra polysilicon layer of the present invention, deposited over the floating gate after planarizing of the oxide insulating layer, allows for varying the width of the control gate. Varying the width of the polysilicon control gate and ONO layer by varying the width of the photoresist mask can alter the capacitance of the floating gate, as desired.

While the invention has been particularly shown and described with reference to the preferred embodiments thereof, it will be understood by those skilled in the art that various changes in form and details may be made without departing from the spirit and scope of the invention.

What is claimed is:

1. A Flash EEPROM device comprising:
    a polysilicon floating gate on the surface of a semiconductor substrate having a first oxide layer thereunder wherein said polysilicon floating gate comprises a first layer and a second layer wherein said second layer is thinner than said first layer wherein the top surface of said first layer is smooth thereby making the top surface of said floating gate smooth;
    a second oxide layer overlying said semiconductor substrate adjacent to said floating gate and having the same thickness as said first layer of said floating gate and said first oxide layer together;
    source and drain regions within said semiconductor substrate associated with said floating gate;
    an interpoly dielectric layer overlying said polysilicon floating gate;
    a control gate overlying said interpoly dielectric layer;
    an insulating layer overlying said semiconductor substrate and said control gate; and
    a patterned metal layer overlying said insulating layer and extending through contact openings in said insulating layer to underlying said control gate and to underlying said source and drain regions to complete said Flash EEPROM device.

2. The device according to claim 1 wherein interpoly dielectric layer comprises:
    a first layer of silicon oxide overlying said polysilicon floating gate having a thickness of between about 50 and 100 Angstroms;
    a layer of silicon nitride overlying said first layer of silicon oxide having a thickness of between about 50 and 100 Angstroms; and
    a second layer of silicon oxide overlying said silicon nitride layer having a thickness of between about 20 and 50 Angstroms.

3. The device according to claim 1 wherein said control gate comprises:
    a first layer of polysilicon overlying said interpoly dielectric layer;
    a second layer of silicide overlying said first polysilicon layer, and
    a capping polysilicon layer overlying said silicide layer.

4. The device according to claim 1 wherein said conducting layer comprises aluminum.

5. The device according to claim 1 further comprising a passivation layer overlying said patterned metal layer.

6. The device according to claim 1 wherein said floating gate has a thickness of between about 1300 and 3500 Angstroms.

7. A Flash EEPROM device comprising:
    a polysilicon floating gate on the surface of a semiconductor substrate having an oxide layer thereunder wherein said polysilicon floating gate comprises a first layer and a second layer wherein said second layer is thinner than said first layer wherein said second layer of said floating gate has a width greater than a width of said first layer of said floating gate wherein the top surface of said first layer is smooth thereby making the top surface of said floating gate smooth;
    a second oxide layer overlying said semiconductor substrate adjacent to said floating gate and having the same thickness as said first layer of said floating gate and said first oxide layer together;
    source and drain regions within said semiconductor substrate associated with said floating gate;
    an interpoly dielectric layer overlying said polysilicon floating gate;
    a control gate overlying said interpoly dielectric layer wherein said second layer of said floating gate has a width equal to a width of said control gate;
    an insulating layer overlying said semiconductor substrate and said control gate; and
    a patterned metal layer overlying said insulating layer and extending through contact openings in said insulating layer to underlying said control gate and to underlying said source and drain regions to complete said Flash EEPROM device.

8. The device according to claim 7 wherein said floating gate has a thickness of between about 1300 and 3500 Angstroms.

9. The device according to claim 7 wherein interpoly dielectric layer comprises:
    a first layer of silicon oxide overlying said polysilion floating gate having a thickness of between about 50 and 100 Angstroms;
    a layer of silicon nitride overlying said first layer of silicon oxide having a thickness of between about 50 and 100 Angstroms; and
    a second layer of silicon oxide overlying said silicon nitride layer having a thickness of between about 20 and 50 Angstroms.

10. The device according to claim 7 wherein said control gate comprises:
    a first layer of polysilicon overlying said interpoly dielectric layer;
    a second layer of silicide overlying said first polysilicon layer, and
    a capping polysilicon layer overlying said silicide layer.

11. The device according to claim 7 wherein said conducting layer comprises aluminum.

12. The device according to claim 7 further comprising a passivation layer overlying said patterned metal layer.

13. A Flash EEPROM device comprising:
    a polysilicon floating gate on the surface of a semiconductor substrate having an oxide layer thereunder wherein said polysilicon floating gate comprises a first layer and a second layer wherein said second layer is thinner than said first layer, wherein the top surface of said first layer is smooth, wherein said second layer has a width greater than a width of said first layer, and wherein the top surface of said floating gate is smooth;
    source and drain regions within said semiconductor substrate associated with said floating gate;
    an interpoly dielectric layer overlying said polysilicon floating gate;
    a control gate overlying said interpoly dielectric layer wherein said second layer of said floating gate has a width equal to a width of said control gate;

an insulating layer overlying said semiconductor substrate and said control gate; and a patterned metal layer overlying said insulating layer and extending through contact openings in said insulating layer to underlying said control gate and to underlying said source and drain regions to complete said Flash EEPROM device.

14. The device according to claim 13 wherein said floating gate has a thickness of between about 1300 and 3500 Angstroms.

15. The device according to claim 13 further comprising an oxide layer overlying said semiconductor substrate adjacent to said floating gate and having the same thickness as said first layer of said floating gate and said oxide layer together.

16. The device according to claim 13 wherein said interpoly dielectric layer comprises:

a first layer of silicon oxide overlying said polysilicon floating gate having a thickness of between about 50 and 100 Angstroms;

a layer of silicon nitride overlying said first layer of silicon oxide having a thickness of between about 50 and 100 Angstroms; and a second layer of silicon oxide overlying said silicon nitride layer having a thickness of between about 20 and 50 Angstroms.

17. The device according to claim 13 wherein said control gate comprises:

a first layer of polysilicon overlying said interpoly dielectric layer;

a layer of silicide overlying said first polysilicon layer, and a capping polysilicon layer overlying said silicide layer.

18. The device according to claim 13 wherein said metal layer comprises aluminum.

19. The device according to claim 13 further comprising a passivation layer overlying said patterned metal layer.

* * * * *